United States Patent
Cho et al.

(10) Patent No.: US 7,768,103 B2
(45) Date of Patent: Aug. 3, 2010

(54) TAPE DISTRIBUTION SUBSTRATE HAVING PATTERN FOR REDUCING EMI

(75) Inventors: Young-sang Cho, Suwon-si (KR); Hee-seok Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 965 days.

(21) Appl. No.: 11/482,139

(22) Filed: Jul. 7, 2006

(65) Prior Publication Data

US 2007/0012774 A1    Jan. 18, 2007

(30) Foreign Application Priority Data

Jul. 12, 2005    (KR)    ...................... 10-2005-0062904

(51) Int. Cl.
*H01L 23/495*    (2006.01)
(52) U.S. Cl. ...................................... 257/672; 257/676
(58) Field of Classification Search .......... 257/672–676
See application file for complete search history.

(56) References Cited

U.S. PATENT DOCUMENTS 7,271,439 B2 *    9/2007    Park ........................... 257/327

2001/0042906 A1 *    11/2001    Nakamura et al. .......... 257/668
2003/0141501 A1 *    7/2003    Komurasaki et al. .......... 257/44

FOREIGN PATENT DOCUMENTS

| JP | 07-321463 | 12/1995 |
| JP | 11-017304 | 1/1999 |
| JP | 2004-363315 | 12/2004 |

* cited by examiner

*Primary Examiner*—Jeremy C Norris
(74) *Attorney, Agent, or Firm*—Volentine & Whitt, PLLC

(57) ABSTRACT

A tape distribution substrate comprises a plurality of distribution lines formed on a base film. In one embodiment, the distribution lines comprise data lines arranged in data line pairs, wherein each data line pair carries a data signal with two different polarities. The distance between the data lines in each data line pair becomes narrower as the data lines extend away from the base film. In another embodiment, the distribution lines comprise power distribution lines, each having a body portion including several holes, and divided into one or more sub-power distribution lines connected to the base film.

18 Claims, 9 Drawing Sheets

TAPE DISTRIBUTION SUBSTRATE HAVING PATTERN FOR REDUCING EMI

BACKGROUND OF THE INVENTION

1. Field of the Invention

Embodiments of the present invention relate generally to tape substrates. More particularly, embodiments of the invention relate to a tape distribution substrate having a pattern adapted to reduce an amount of electromagnetic interference (EMI) between distribution lines of the tape distribution substrate.

A claim of priority is made to Korean Patent Application No. 10-2005-0062904, filed on Jul. 12, 2005, the disclosure of which is hereby incorporated by reference in its entirety.

2. Description of Related Art

Conventional display panel assemblies include display panels, printed circuit boards (PCBs), and tape distribution substrates connecting the display panels to the PCBs. The tape distribution substrates transmit electrical signals from the PCBs to the display panels to drive various components associated with the display panels. Most display panels are connected to a gate PBC by a gate tape distribution substrate, and to a source PCB by a source tape distribution substrate.

FIG. 1 is a plan view of a part of a conventional source tape distribution substrate 10. Source tape distribution substrate 10 comprises a plurality of distribution lines for transmitting data to a display panel from a source PCB. Among the distribution lines are data distribution lines 13, which transmit data signals to the display panel. Data distribution lines 13 are arranged on a base film 11 of the source tape distribution substrate 10. Base film 11 has a chip mounting portion 11a on which a semiconductor chip is mounted. A protective layer 12 is formed on base film 11 to cover data distribution lines 13. However, protective layer 12 is not formed on chip mounting portion 11a. Protective layer 12 is formed on base film 11 so that portions of data distribution lines 13, which are connected to pads of the source PCB are left exposed. Pads 16-1, 16-2, and 16-3 that will be electrically connected to bumpers of the semiconductor chip are arranged on chip mounting portion 11a, and connected to respective pairs of data lines 13-1, 13-2, and 13-3 of data distribution lines 13.

Data distribution lines 13 include a plurality of pairs of data lines 13-1, 13-2, and 13-3 that divide data signals D1, D2, and D3 into pairs of data signals having opposite phases (D1(+), D1(−)), (D2(+), D2(−)), and (D3(+), D3(−)) and transmit the data signals. The pairs of data lines 13-1, 13-2, and 13-3 respectively include first and second data lines (13-1a, 13-1b), (13-2a, 13-2b), and (13-3a, 13-3b). First and second data lines (13-1a, 13-1b), (13-2a, 13-2b), and (13-3a, 13-3b) of data line pairs 13-1, 13-2, and 13-3 are respectively combined into single data lines through connection cells 13-1c, 13-2c, and 13-3c.

Therefore, when the pairs of data signals (D1(+), D1(−)), (D2(+), D2(−)), and (D3(+), D3(−)) having opposite phases are provided from the source PCB, the pairs of data signals (D1(+), D1(−)), (D2(+), D2(−)), and (D3(+), D3(−)) are respectively input into first and second data lines (13-1a, 13-1b), (13-2a, 13-2b), and (13-3a, 13-3b) of the data line pairs 13-1, 13-2, and 13-3. The pairs of data signals (D1(+), D1(−)), (D2(+), D2(−)), and (D3(+), D3(−)) provided to the respective first and second data lines (13-1a, 13-1b), (13-2a, 13-2b), and (13-3a, 13-3b) are combined into single data signals D1, D2, and D3 through the connection cells 13-1c, 13-2c, and 13-3c, and then provided to pads 16-1, 16-2, and 16-3 of chip mounting portion 11a through data lines 13-1, 13-2, and 13-3, respectively.

In tape distribution substrate 10, connection cells 13-1c, 13-2c, and 13-3c are arranged between respective data line pairs 13-1, 13-2, and 13-3 to connect the respective first and second data lines of each pair. Each pair of first and second data lines distribution lines in a pair are arranged with a first distance P11 therebetween. In addition, each pair of data lines is arranged at a second distance P12 from a next pair. First distance P11 between first and second data lines of the same data line pair is larger than second distance P12 between adjacent data lines of different data line pairs. Because of the closeness of adjacent data lines transmitting different signals, EMI can occur between the adjacent data line.

FIG. 2 is a plan view of another part of conventional source tape distribution substrate 10. FIG. 2 illustrates a part of a power distribution line 14 for providing a power voltage Vdd and a ground voltage Vss from a source PCB to a display panel. Referring to FIG. 2, power distribution line 14 includes a plurality of sub-power distribution lines 14-1, 14-2, and 14-3, and a connection portion 14a for combining the sub-power distribution lines 14-1, 14-2, and 14-3. Connection portion 14a of power distribution line 14 is exposed out of protective layer 12 to receive a power signal such as power voltage Vdd or ground voltage Vss from the source PCB. Sub-power distribution lines 14-1, 14-2, and 14-3 are respectively connected to pads 18-1, 18-2, and 18-3 disposed on chip mounting portion 11a to provide predetermined power to a semiconductor chip that will be mounted on chip mounting portion 11a.

Power distribution line 14 is divided into a plurality of sub-power distribution lines 14-1, 14-2, and 14-3 to supply power to the semiconductor chip mounted on the chip mounting portion 11a. Because sub-power distribution lines 14-1, 14-2, and 14-3 are combined into one line at connection portion 14a, as the lengths of sub-power distribution lines 14-1, 14-2, and 14-3 increase, the line resistance of these sub-power distribution lines also increases. In addition, since a plurality of sub-power distribution lines 14-1, 14-2, and 14-3 are formed adjacent to each other, EMI occurs between neighboring power distribution lines.

FIG. 3 is a plan view of yet another part of conventional source tape distribution substrate 10. FIG. 3 illustrates a dummy pattern and distribution lines adjacent to the dummy pattern on conventional source tape distribution substrate 10. Referring to FIG. 3, source tape distribution substrate 10 includes a portion having a high pattern-density in which a plurality of distribution lines 15 are arranged, and a portion having a low pattern-density. Dummy distribution patterns 20 are arranged in the portion having the low pattern-density. Dummy distribution patterns 20 include holes 21 in a stripe shape extending along a length direction of distribution lines 15. Since conventional tape distribution substrate 10 includes holes 21, line patterns extending in the same direction as the distribution lines are formed between holes 21, and thus, EMI occurs.

SUMMARY OF THE INVENTION

According to one embodiment of the invention, a tape distribution substrate comprises a base film including a chip mounting portion on which a semiconductor chip is mounted, and a plurality of distribution line pairs formed on the base film. Each distribution line pair comprises a first distribution line and a second distribution line respectively providing a pair of signals having opposite phases, to the semiconductor chip. The first and second distribution lines of each distribution line pair each include a first portion contacting the chip mounting portion, a second portion separated from the chip mounting portion, and a third portion between the first and second portions. The respective first portions of the first and second distribution lines within each distribution line pair are separated by a first distance. The respective second portions of the first and second distribution lines within each distribution line pair are separated by a second distance that is smaller than the first distance.

According to another embodiment of the invention, a tape distribution substrate comprises a base film including a chip mounting portion on which a semiconductor chip is mounted, and a plurality of distribution lines formed on the base film. Each of the distribution lines receives a first signal and provides a plurality of second signals to the semiconductor chip on the chip mounting portion and each of the second signals is substantially identical to the first signal. Each of the distribution lines comprises a body portion adapted to receive the first signal and a plurality of sub-distribution lines extending from the body portion toward the chip mounting portion to provide the plurality of second signals to the semiconductor chip.

According to yet another embodiment of the invention, a tape distribution substrate comprises a base film including a chip mounting portion on which a semiconductor chip is mounted, a plurality of distribution lines arranged on the base film and providing a plurality of signals to the semiconductor chip of the chip mounting portion, and a dummy distribution pattern formed adjacent to the plurality of distribution lines. The dummy distribution pattern has a plurality of holes arranged such that the dummy distribution pattern has a mesh shape.

BRIEF DESCRIPTION OF THE DRAWINGS

The invention is described below in relation to several embodiments illustrated in the accompanying drawings. Throughout the drawings like reference numbers indicate like exemplary elements, components, or steps, and the thickness of layers is exaggerated for clarity. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

Figure 4:
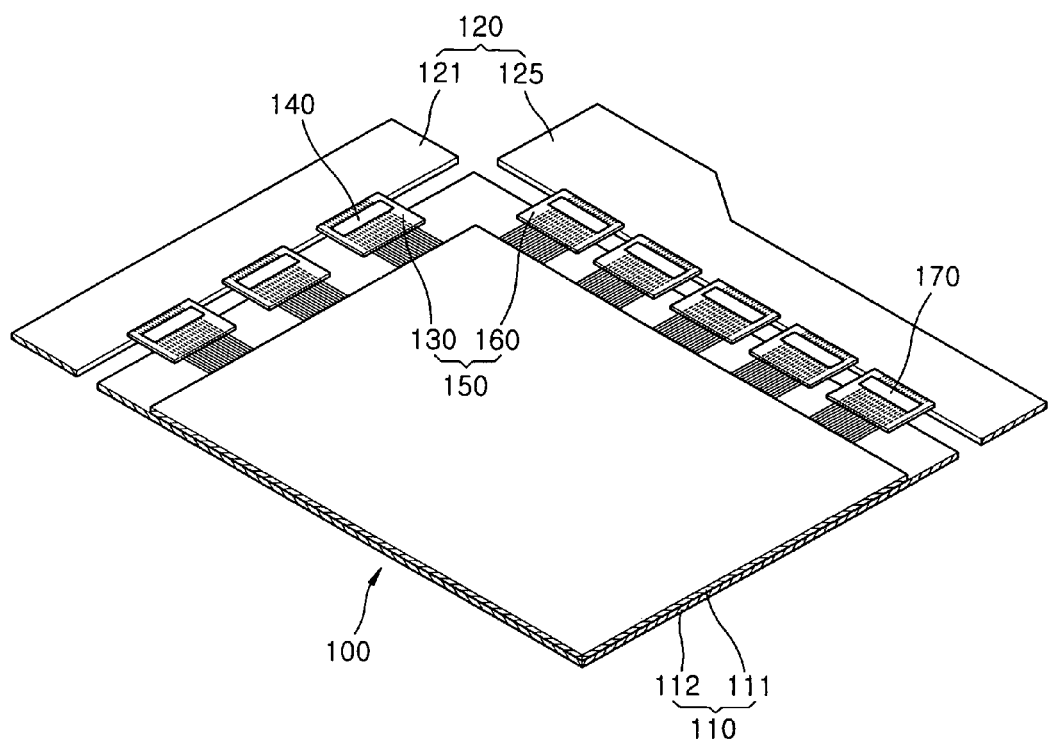
FIG. 4 is a schematic diagram of a display panel assembly according to an embodiment of the present invention.

FIG. 4 is a schematic diagram of a display panel assembly 100 according to an embodiment of the present invention. Display panel assembly 100 typically comprises a thin film transistor-liquid crystal display (TFT-LCD), a plasma display panel (PDP), an organic light emitting diode (OLED), or a field emission display (FED), but it is not limited thereto. For purposes of explanation, it will be assumed that display panel assembly 100 is a TFT-LCD.

Referring to FIG. 4, display panel assembly 100 includes a display panel 110, a printed circuit board (PCB) 120, and a tape distribution substrate 150 connecting display panel 110 to PCB 120. Display panel 110 comprises a lower substrate 112, and an upper substrate 111 facing lower substrate 112. Although not shown in FIG. 4, thin film transistors, gate lines, data lines, and pixel electrodes connected to the thin film transistors are arranged on lower substrate 112, and a color filter and a common electrode are typically formed on upper substrate 111. Display panel 110 further comprises a sheet of liquid crystals (not shown) between upper and lower substrates 111 and 112. Components arranged on upper and lower substrates 111 and 112 are not limited to the above arrangement, but can be variously arranged according to a driving method of display panel 110.

PCB 120 comprises a gate PCB 121 providing display panel 110 with a plurality of gate driving signals, and a source PCB 125 providing display panel 110 with a plurality of data driving signals. Gate PCB 121 provides the gate driving signals for driving the respective thin film transistors arranged on display panel 110, and source PCB 125 provides the data driving signals for driving the respective thin film transistors.

Although PCB 120 comprises gate PCB 121 and source PCB 125, it is not limited thereto. For example, gate PCB 121 and source PCB 125 can be combined into one PCB including a plurality of driving devices, which are semiconductor chips designed using one-chip circuit technology. The gate driving signals and the data driving signals for driving the thin film transistors of display panel 110 are provided to semiconductor chips 140 and 170 mounted on gate and source tape distribution substrates 130 and 160, respectively.

Tape distribution substrate 150 includes a plurality of gate tape distribution substrates 130 for electrically connecting gate PCB 121 to display panel 110, and a plurality of source tape distribution substrates 160 for electrically connecting source PCB 125 to display panel 110. Semiconductor chips 140 receive the gate driving signals from gate PCB 121 and provide the gate driving signals to display panel 110 through gate tape distribution substrates 130. More specifically, semiconductor chips 140 receive the gate driving signals, and provide the gate driving signals to the thin film transistors of display panel 110 through corresponding gate lines.

Figure 5:
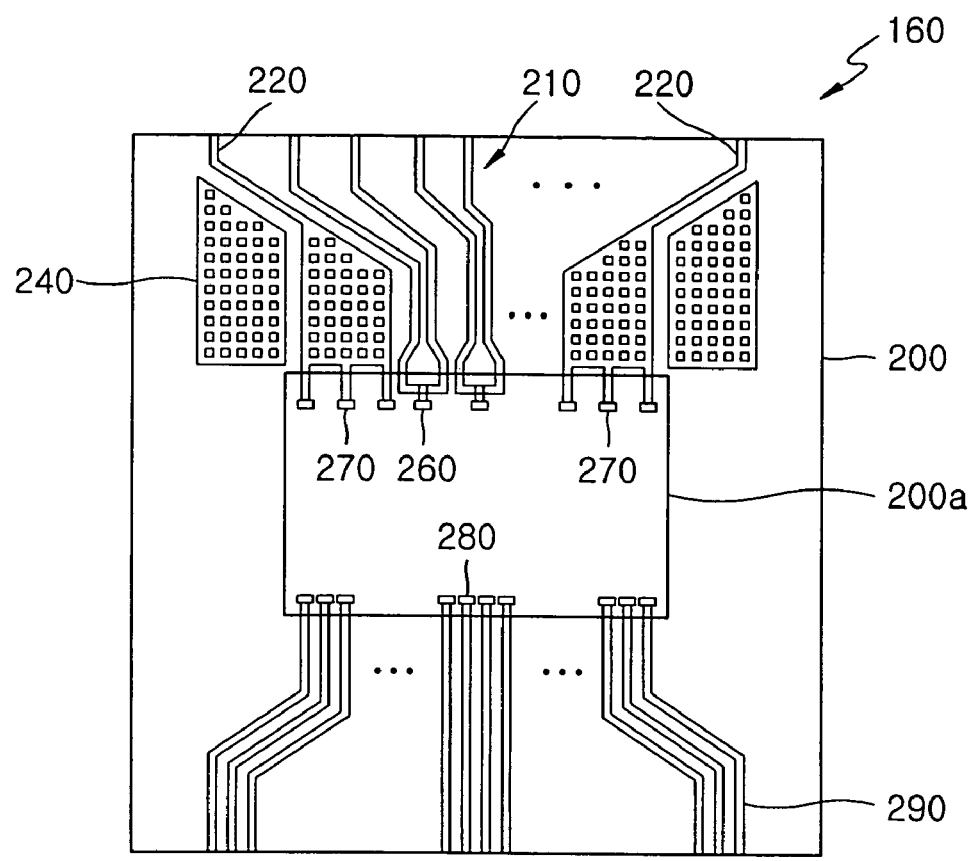
FIG. 5 is a plan view of a source gate distribution substrate according to an embodiment of the present invention.

FIG. 5 is a plan view of one of source tape distribution substrates 160 shown in FIG. 4. Referring to FIG. 5, source tape distribution substrate 160 comprises a base film 200, and a chip mounting portion 200a formed in base film 200. One of semiconductor chips 170 is mounted on chip mounting portion 200a. source distribution substrate 160 further comprises a dummy distribution pattern 240, input distribution lines 210 and 220, contact pads 260, 270, and 280, and output distribution lines 290.

Contact pads 260, 270, and 280 are arranged on chip mounting portion 200a and electrically connected to a bumper of semiconductor chip 170. Contact pad 260 is an input contact pad adapted to receive the data driving signal from source PCB 125. Contact pad 270 is an input contact pad to receive a power signal, for example, a power voltage Vdd or a ground voltage Vss, from source PCB 125. Contact pad 280 is an output contact pad providing display panel 110 with various signals for driving display panel 110 from semiconductor chip 170.

Input distribution lines 210 and 220 electrically connect source PCB 125 to input contact pads 260 and 270 of chip mounting portion 200a. Output distribution lines 290 electrically connect display panel 110 to output contact pad 280 of chip mounting portion 200a. Collectively, input and output distribution lines 210, 220, and 290 are referred to as data distribution lines. The data distribution lines are typically protected by a protective layer such as a solder resist 250. Portions of input distribution lines 210 and 220 that are adjacent to source PCB 125 are exposed to be electrically connected to the pad (not shown) of source PCB 125, and portions of output distribution line 290 that are adjacent to display panel 110 are exposed to be electrically connected to the pad (not shown) of display panel 110.

Gate tape distribution substrates 130 and source tape distribution substrates 160 typically comprise flexible printed circuit boards (FPCBs) such as tape carrier packages (TCPs) or chip-on-films (COFs) that are fabricated by forming distribution lines on a base film. Gate and source tape distribution substrates 130 and 160 are generally fabricated using a tape automated bonding (TAP) technology, or in other words, the distribution lines formed on the base film are bonded simultaneously to bumps formed on the semiconductor chip. However, gate and source tape distribution substrates 130 and 160 are not limited to the above exemplary configurations.

Figure 6:
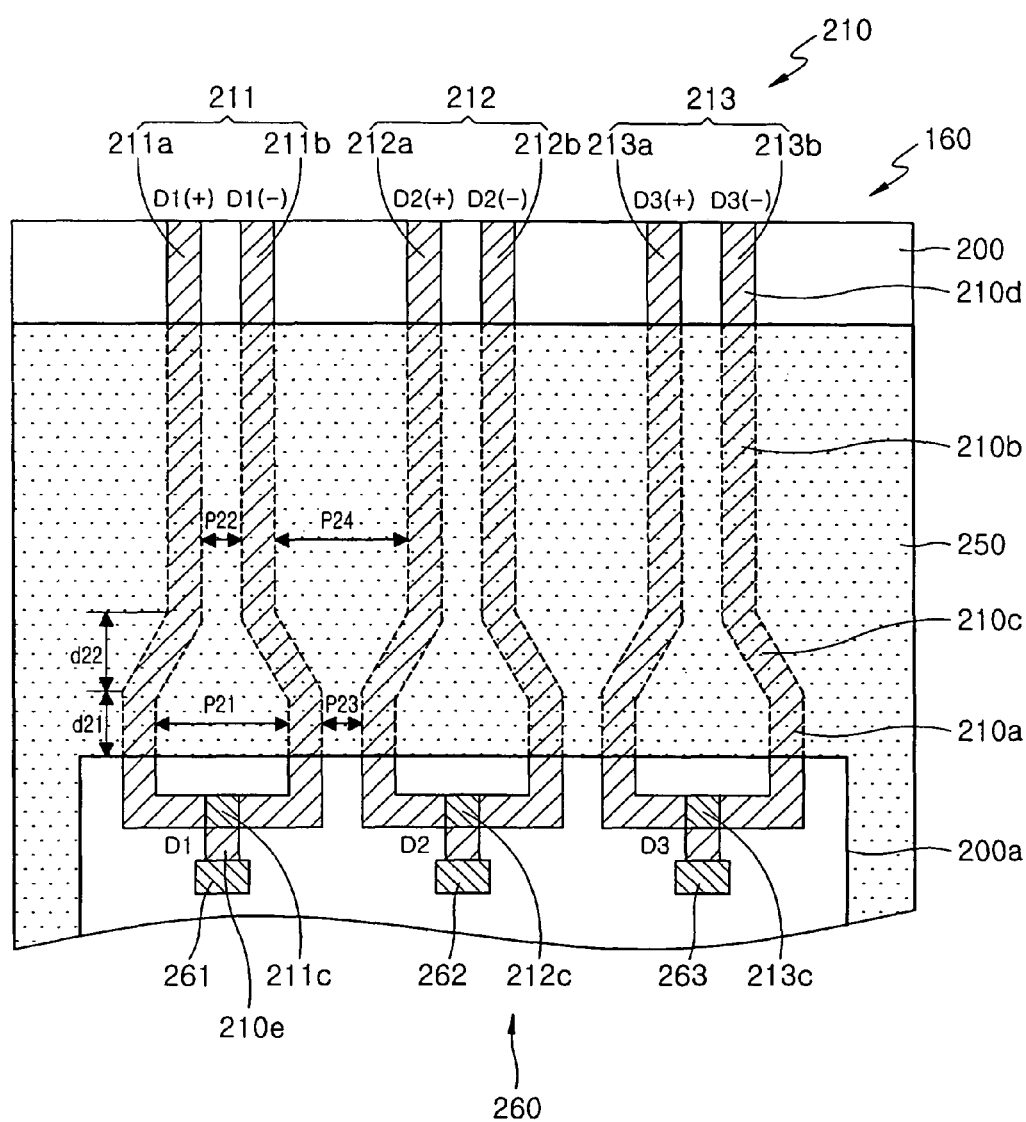
FIG. 6 is an enlarged plan view of a data distribution line on the source tape distribution substrate shown in FIG. 5 according to an embodiment of the present invention.

FIG. 6 is an enlarged plan view of a part of source tape distribution substrate 160. In particular, FIG. 6 shows input distribution lines 210 arranged on base film 200. Base film 200 typically comprises an insulating film such as a polyimide and includes chip mounting portion 200a, on which semiconductor chip 170 is mounted. Protective layer 250 is formed on base film 200 to protect input distribution lines 210. Protective layer 250 is generally formed to cover all of base film 200 except for a region where chip mounting portion 200a is formed.

Input distribution lines 210 generally include a plurality of pairs of data distribution lines 211, 212, and 213. The pairs of data distribution lines 211, 212, and 213 include respective first and second distribution lines (211a, 211b), (212a, 212b), and (213a, 213b) for dividing data signals D1, D2, and D3 into pairs of data signals (D1(+), D1(−)), (D2(+), D2(−)), and (D3(+), D3(−)) having opposite phases and for transmitting the data signals. The first and second distribution lines (211a, 211b), (212a, 212b), and (213a, 213b) within the pairs of data distribution lines 211, 212, and 213 are connected to each other through connection cells 211c, 212c, and 213c, and provide semiconductor chip 170 mounted on the chip mounting portion 200a with combined data signals D1, D2, and D3.

First and second distribution lines (211a, 211b), (212a, 212b), and (213a, 213b) of the pairs of data distribution lines 211, 212, and 213 respectively include first portions 210a arranged parallel to each other with first distances P21 therebetween, second portions 210b arranged parallel to each other with second distances P22 therebetween, third portions 210c connecting the first portions 210a and the second portions 210b, and fourth portions 210d electrically connected to pads of source PCB 125. In addition, the pairs of data distribution lines 211, 212, and 213 further include fifth portions 210e connecting connection cells 211c, 212c, and 213c to input pads 261, 262, and 263, respectively.

In the present embodiment, the pairs of data distribution lines 211, 212, and 213 are arranged with predetermined distances therebetween, however, they can be arranged in various ways, for example, distances P21 and P22 can be constant while the distances between the third portions and the fourth portions can gradually increase or decrease. In addition, widths of the distribution lines are constant in the present invention, however, the widths of the distribution lines may increase toward source PCB 125.

First portions 210a of the pairs of data distribution lines 211, 212, and 213 are connected to each other by the connection cells 211c, 212c, and 213c to combine the pairs of data signals (D1(+), D1(−)), (D2(+), D2(−)), and (D3(+), D3(−)) having opposite phases into single data signals D1, D2, and D3, respectively. Fifth portions 210e are connected to connection cells 211c, 212c, and 213c, and data signals D1, D2, and D3 are provided to semiconductor chip 170 through input pads 261, 262, and 263. Connection cells 211c, 212c, and 213c are control cells for combining pairs of the data signals (D1(+), D1(−)), (D2(+), D2(−)), and (D3(+), D3(−)) having opposite phases into data signals D1, D2, and D3.

Second portions 210b and the third portions 210c of the first and second distribution lines (211a, 211b), (212a, 212b), and (213a, 213b) of the pairs of data distribution lines 211, 212, and 213 are covered by protective layer 250, and fourth portions 210d are exposed. First portions 210a are partially covered by protective layer 250, and are spaced apart from each other at first distances P21 under protective layer 250. Since connection cells 211c, 212c, and 213c are disposed between first and second distribution lines (211a, 211b), (212a, 212b), and (213a, 213b) of the pairs of data distribution lines 211, 212, and 213, first distances P21 between the first portions 210a may be maintained constant. Second portions 210b are arranged with second distances P22, which are smaller than first distances P21, in order to reduce EMI between the neighboring pairs of distribution lines.

For explanation purposes, first and second pairs of data distribution lines 211 and 212 that are adjacent to each other among the plurality of pairs of the data distribution lines 211, 212, and 213 will be described as follows. The first pair of data distribution lines 211 includes first distribution line 211a transmitting first data signal D1(+) of positive polarity and second distribution line 211b transmitting first data signal D1(−) of negative polarity. Second pair of data distribution lines 212 includes first data distribution line 212a transmitting second data signal D2(+) of positive polarity and second data distribution line 212b transmitting second data signal D2(−) of negative polarity. First distance P21 between first portions 210a of first and second distribution lines (211a, 211b) and (212a, 212b) is larger than second distance P22 between second portions 210b. The distance between third portions 210c is reduced from chip mounting portion 200a where connection cells 211c, 212c, and 213c are arranged toward second portion 210b.

A third distance P23 between first portions 210a of second distribution line 211b of first pair of data distribution lines 211 and first distribution line 212a of the second pair of data distribution lines 212 is smaller than a fourth distance P24 between second portions 210b. The distance between adjacent third portions 210c of different pairs of data distribution lines increases gradually from chip mounting portion 200a where connection cells 211c, 212c, and 213c are arranged toward second portions 210b. First distance P21 is preferably larger than third distance P23 and second distance P22 is preferably smaller than fourth distance P24.

A length of first portion 210a is determined according to a design rule of the tape distribution substrate, and may be as short as possible in order to reduce EMI between neighboring distribution line pairs. The length of first portion 210a disposed under protective layer 250, i.e., a distance d21 between third portion 210c and chip mounting portion 200a, is typically determined by a processing tolerance, i.e., the measurement precision of processes used to form protective layer 250. The pairs of distribution lines 211, 212, and 213 are bent at the portions where third portions 210c start, and the bent portions are weak against external factors. When the bent portions are exposed, they may cause a short circuit. Therefore, first portions 210a may extend a predetermined distance from chip mounting portion 200a so that the bent portions are not exposed. Distance d21 is preferably greater than or equal to a tolerance of a process used to apply solder resist when forming protective layer 250. For instance, distance d21 is typically at least 200 μm. In addition, distance d22 between first portion 210a and second portion 210b may be 1000 μm or larger so that third portion 210c can be inclined gently in order to prevent defects such as a short circuit from occurring at the bent portions.

Therefore, on source tape distribution substrate 160 including data distribution lines 210, the pairs of the data signals (D1(+), D1(−)), (D2(+), D2(−)), and (D3(+), D3(−)) having opposite phases are transmitted from source PCB 125 through first and second distribution lines (211a, 211b), (212a, 212b), and (213a, 213b) of pairs of data distribution lines 211, 212, and 213. The pairs of data signals (D1(+), D1(−)), (D2(+), D2(−)), and (D3(+), D3(−)) having opposite phases are combined into single signals D1, D2, and D3 through the connection cells 211c, 212c, and 213c, and supplied to semiconductor chip 170 through input pads 261, 262, and 263 on chip mounting portion 200a. Since the pairs of distribution lines 211, 212, and 213 are arranged to reduce EMI, the influence of the data signals on EMI can be reduced.

The structure of the distribution lines shown in FIG. 6 can be also used for the distribution lines that divide signals into pairs of signals having different phases and transmit the signals.

Figure 7:
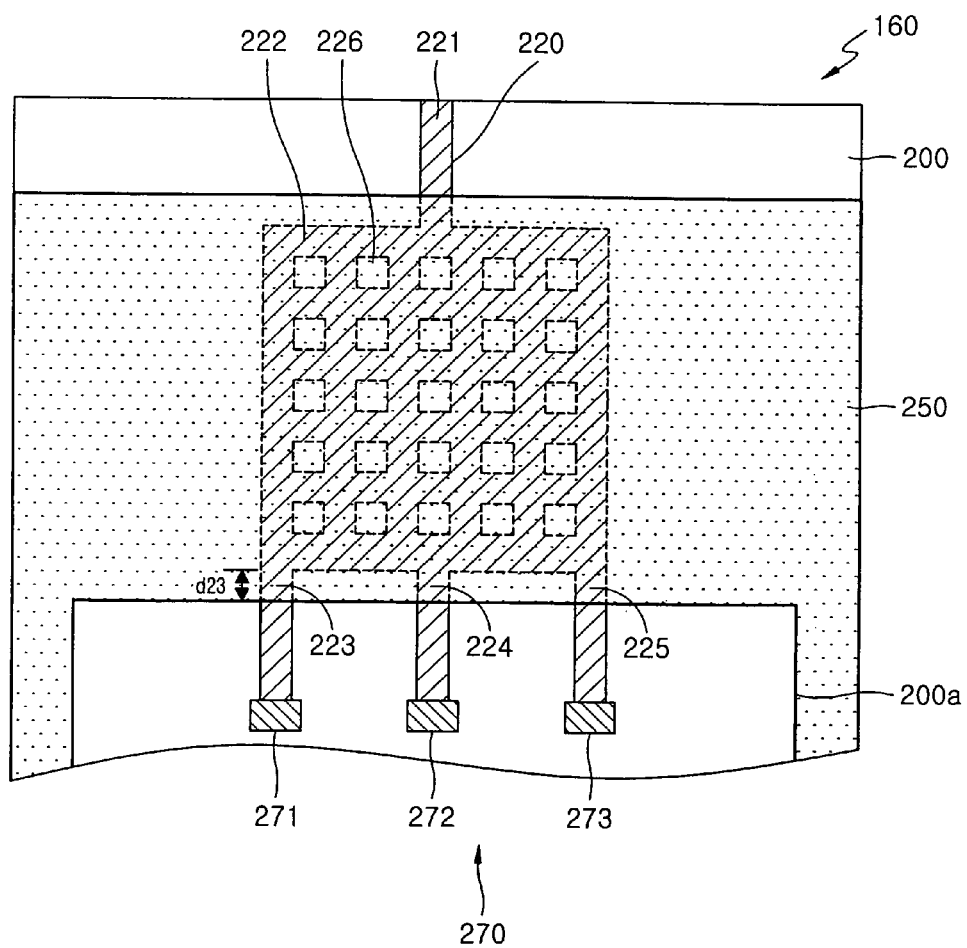
FIG. 7 is an enlarged plan view of a power distribution line on the source tape distribution substrate shown in FIG. 5 according to an embodiment of the present invention.

FIG. 7 is an enlarged plan view of another portion of source tape distribution substrate 160 according to an embodiment of the present invention. In particular, FIG. 7 illustrates one of input distribution lines 220 that transmits power signals on-source tape distribution substrate 160. The one of input distribution lines 220 shown in FIG. 7 will be referred to as a power distribution line 220 in the following description.

Referring to FIG. 7, power distribution line 220 is arranged on base film 200 and protected by protective layer 250. Power distribution line 220 includes a first portion 221 electrically contacting source PCB 125, a second portion 222, i.e., a body portion, and a plurality of third portions 223, 224, and 225 for transmitting the power signal to a plurality of input pads 271, 272, and 273 arranged in chip mounting portion 200a. First portion 221 is not covered by protective layer 250 and is electrically connected to source PCB 125 to receive a power signal such as a power voltage Vdd or a ground voltage Vss. Third portions 223, 224, and 225 function as sub-power distribution lines.

Second portion 222 is a body portion of power distribution line 220. Since second portion 222 has a square shape and does not include a plurality of sub-power distribution lines such as sub-power distribution lines 14-1, 14-2, and 14-3 shown in FIG. 2, the line resistance of power distribution line 220 is reduced, thereby reducing EMI associated with the line. Third portions 223, 224, and 225 are lines extending from second portion 222. Third portions 223, 224, and 225 extending from second portion 222 are respectively connected to a plurality of input pads 271, 272, and 273 to provide semiconductor chip 170 mounted on the chip mounting portion 200a with power voltage Vdd or ground voltage Vss.

In order to reduce line resistance associated with power distribution line 220, an area of second portion 222 is preferably as large as possible, and lengths of third portions 223, 224, and 225 extending from second portion 222 are preferably as short as possible. Accordingly, the length of second portion 222 formed under protective layer 250, i.e., a distance d23 from chip mounting portion 200a to second portion 222 can be as short as possible.

However, distance d23 should be at least as much as the tolerance of the process of applying the solder resist that is used as protective layer 250. For example, distance d23 is preferably 200 μm or larger. Since the extensions of third portions 223, 224, and 225 from second portion 222 are weak, the extensions are preferably protected by protective layer 250.

In addition, second portion 222 of power distribution line 220 has at least one or more holes 226 in order to minimize EMI on power distribution line 220. The size and number of holes 226 can be changed according to the size of second portion 222, and holes 226 may be arranged regularly or irregularly. Holes 226 are commonly arranged as a mesh to minimize EMI, and thus, second portion 222 of power distribution line 220 is commonly patterned as a mesh.

When a power signal such as power voltage Vdd or ground voltage Vss is provided from source PCB 125 to source tape distribution substrate 160, power signals having the same level are supplied to semiconductor chip 170 of chip mounting portion 200a through third portions 223, 224, and 225 of power distribution line 220 and input pads 271, 272, and 273.

In the exemplary embodiment illustrated in FIG. 7, second portion 222 of power distribution line 220 has a square shape. However, the shape is not limited to a square. In addition, the structure of power distribution line 220 shown in FIG. 7 can be applied to the input distribution line receiving one signal and providing a plurality of signals.

Figure 8:
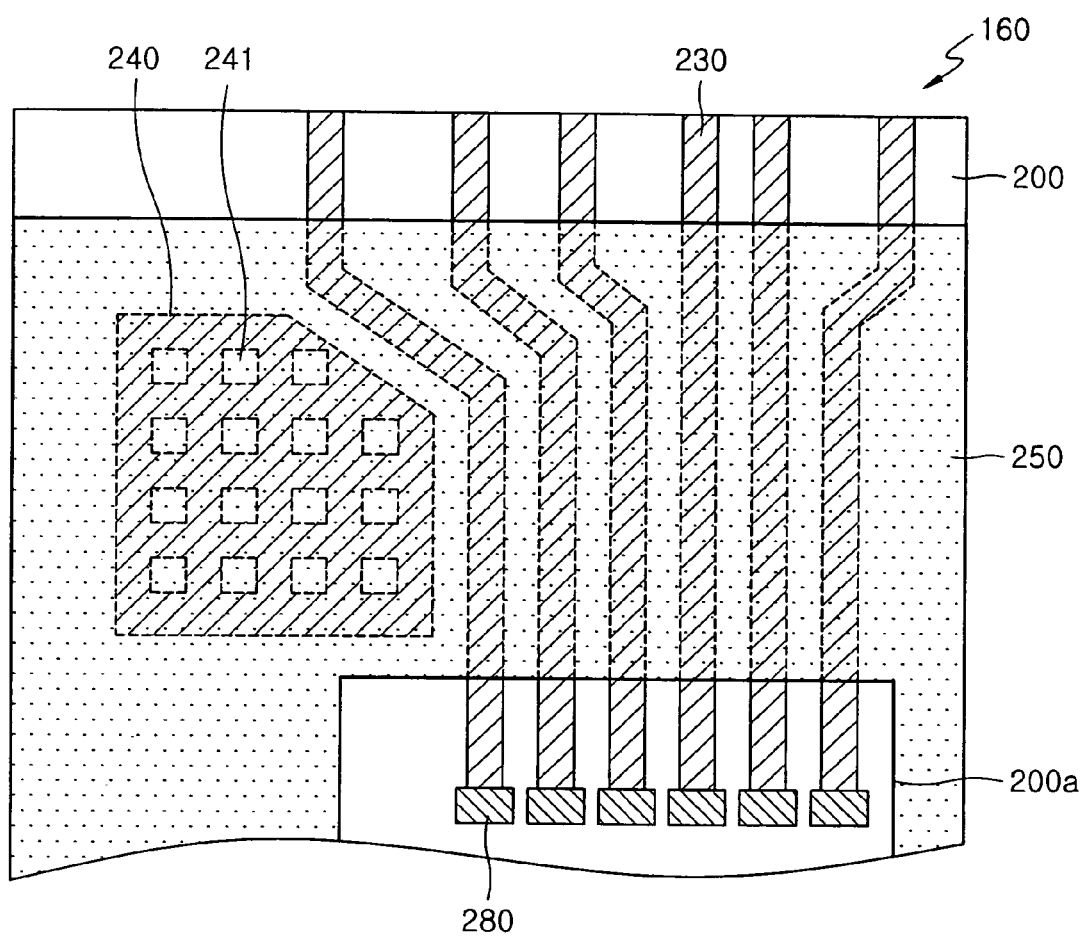
FIG. 8 is an enlarged plan view of a dummy distribution pattern of the source tape distribution substrate shown in FIG. 5 according to an embodiment of the present invention; and, FIGS. 9A through 9B are graphs of EMI data taken from a conventional tape distribution substrate and a tape distribution substrate according to an embodiment of the present invention, respectively.

FIG. 8 is an enlarged plan view of another portion of source tape distribution substrate 160 according to an embodiment of the present invention. FIG. 8 illustrates dummy distribution pattern 240 and input distribution lines adjacent to dummy distribution pattern 240 on source tape distribution substrate 160.

Referring to FIG. 8, source tape distribution substrate 160 includes a portion having high pattern density, on which a plurality of distribution lines 230 are arranged, and a portion having low pattern density on which dummy distribution pattern 240 is arranged. Dummy distribution pattern 240 includes holes 241 adapted to minimize EMI from occurring with an adjacent one of input distribution lines 230.

One or more holes 241 are formed in dummy distribution pattern 240, and the size and number of holes 241 can be changed according to the size of dummy distribution pattern 240. In addition, holes 241 may be arranged regularly or irregularly. Dummy distribution pattern 240 may be patterned to arrange the holes 241 in a mesh form.

Figure 3:
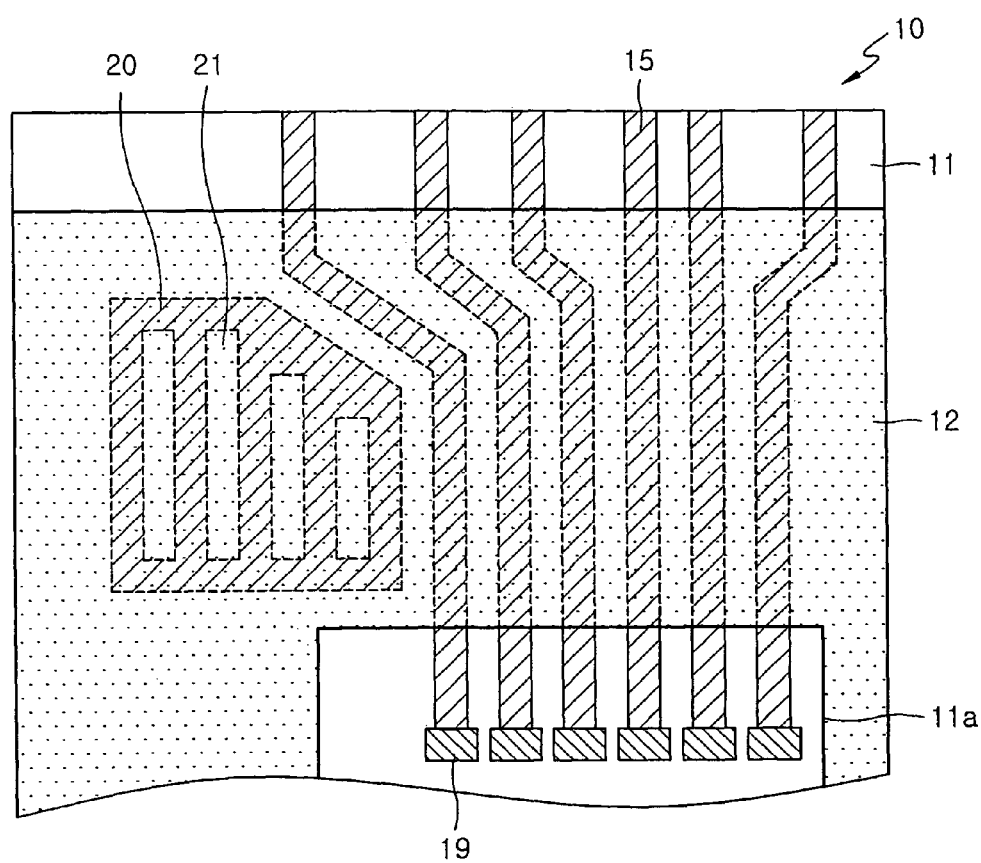
FIG. 3 is a plan view of a conventional source tape distribution substrate including dummy distribution patterns.

In the conventional tape distribution substrate shown in FIG. 3, stripe holes 21 are formed on dummy distribution pattern 20, and thus, portions between holes 21 extend in the length direction of distribution line 15 adjacent to dummy distribution pattern 20, causing EMI. However, in the exemplary embodiment of the invention illustrated in FIG. 8, holes 241 are formed in a mesh, and thus, dummy distribution pattern 240 has a mesh structure that can substantially prevent EMI from being generated with the adjacent input distribution line 230.

Figure 1:
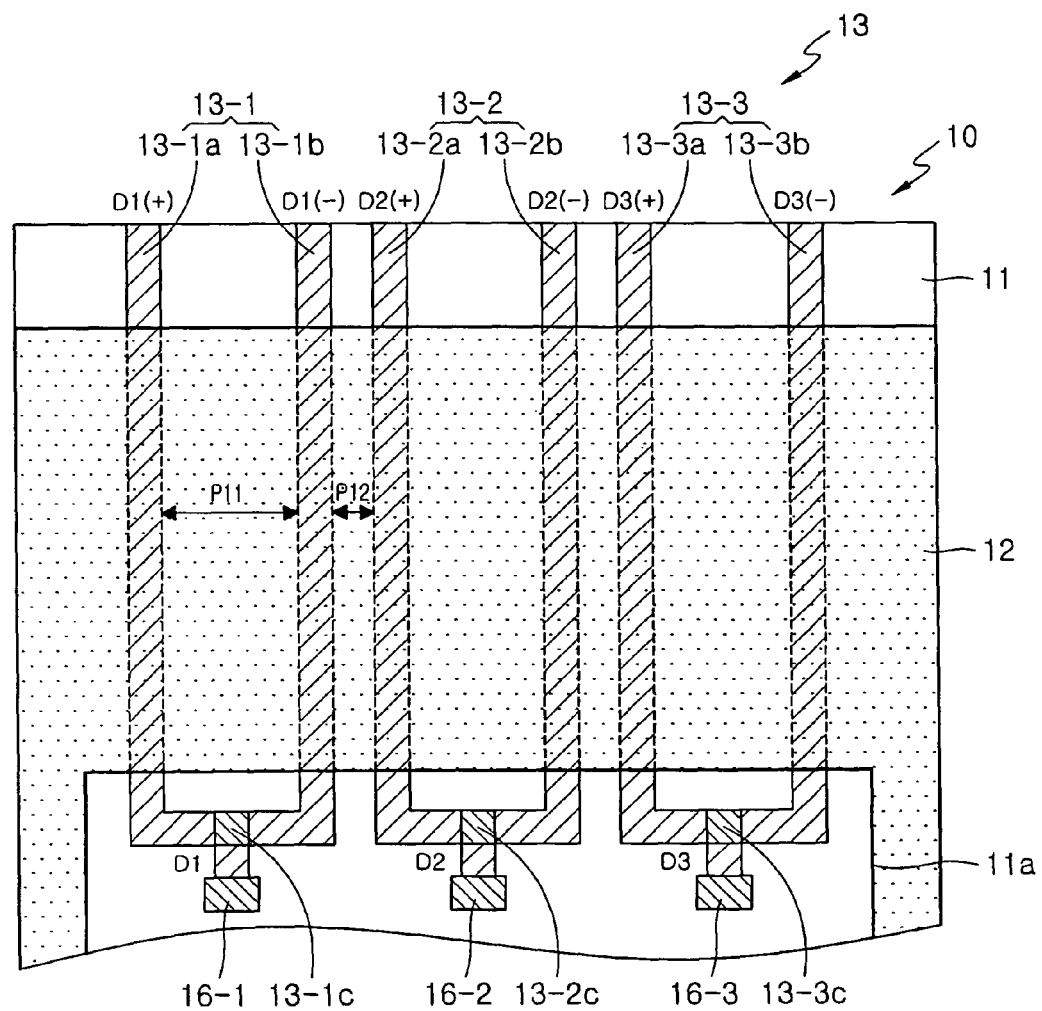
FIG. 1 is a plan view of a conventional source tape distribution substrate including data distribution lines.
Figure 2:
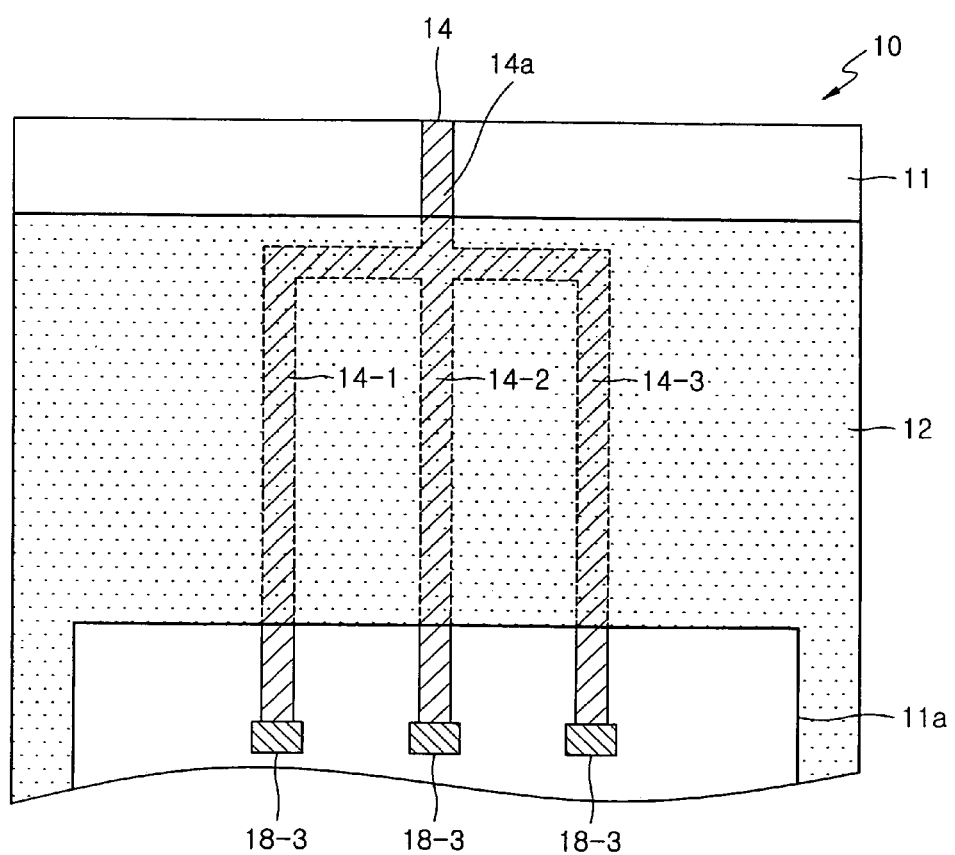
FIG. 2 is a plan view of another source tape distribution substrate including power distribution lines.
Figure 9A:
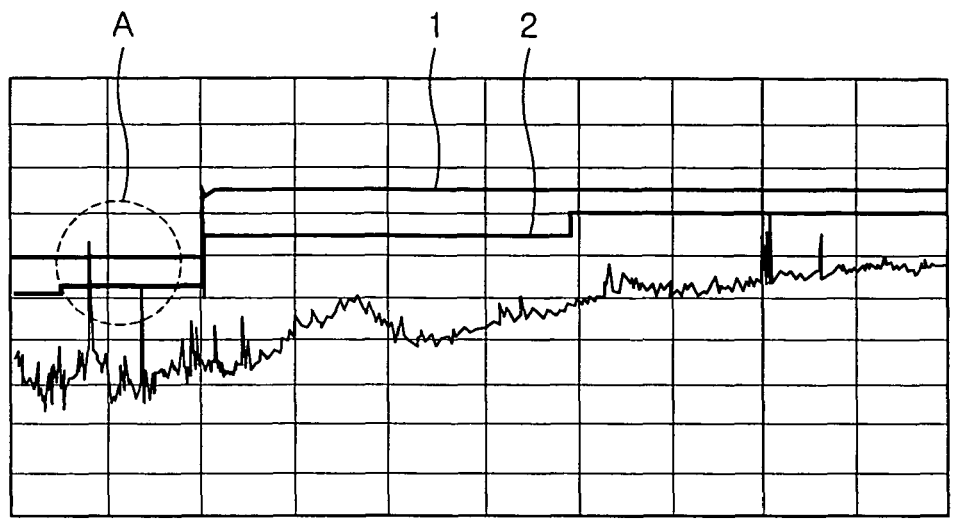
Figure 9B:
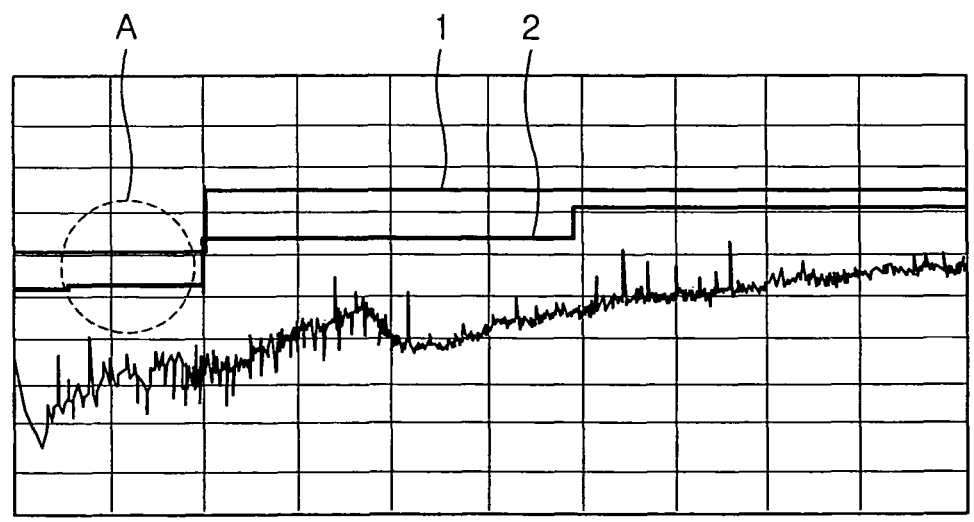

FIG. 9A is a graph of EMI data taken from a conventional tape distribution substrate including the conventional distribution lines illustrated in FIGS. 1, 2, and 3. FIG. 9B is a graph of EMI data taken from a tape distribution substrate including the distribution lines illustrated in FIGS. 6, 7, and 8 according to selected embodiments of the present invention. Referring to FIGS. 9A and 9B, noise is detected in the conventional tape distribution substrate in a frequency band labeled "A". However, in the tape distribution substrate illustrated in FIGS. 6, 7, and 8 no noise is detected in the frequency band labeled "A". In FIGS. 9A and 9B, the number "1" denotes an admissible EMI level for the display panel assembly, and the number "2" represents a standard EMI level of the display panel assembly.

In selected embodiments of the present invention, input distribution lines transmitting signals between source PCB 125 and semiconductor chip 170 mounted on chip mounting portion 200a on source tape distribution substrate 160 have been described. Those skilled in the art will understand that similar techniques can also be applied to output distribution lines for transmitting signals between semiconductor chip 170 and display panel 110 or to distribution lines of gate tape distribution substrate 130. In addition, although holes are formed in a body portion of power distribution line 220 and in dummy distribution pattern 240, the holes may be formed in other distribution lines having a predetermined size or larger to prevent EMI.

As described above, in a tape distribution substrate having distribution lines designed to minimize EMI, the distribution lines within pairs of distribution lines providing a pair of signals having opposite phase are arranged with shorter distance therebetween at the portion apart from the chip mounting portion than the distance at the portion adjacent to the chip mounting portion. Thus, EMI with neighboring pairs of distribution lines is reduced. In addition, distribution lines receiving the same signal, for example, power voltage distribution lines or ground voltage distribution lines are separated into sub-power distribution lines around portions adjacent to a chip mounting portion, thus minimizing EMI.

In addition, in the dummy distribution line, holes are formed in a mesh structure instead of along the length of the distribution line. Accordingly, EMI with adjacent distribution lines is reduced.

The foregoing preferred embodiments are teaching examples. Those of ordinary skill in the art will understand that various changes in form and details may be made to the exemplary embodiments without departing from the scope of the present invention as defined by the following claims.

What is claimed:

1. A tape distribution substrate, comprising:
a base film including a chip mounting portion on which a semiconductor chip is mounted; and,
a plurality of distribution line pairs formed on the base film, wherein each distribution line pair comprises a first distribution line and a second distribution line respectively providing a pair of signals having opposite phases, to the semiconductor chip;
wherein the first and second distribution lines of each distribution line pair each include a first portion contacting the chip mounting portion, a second portion separated from the chip mounting portion, and a third portion between the first and second portions;
wherein the respective first portions of the first and second distribution lines within each distribution line pair are separated by a first distance; and,
wherein the respective second portions of the first and second distribution lines within each distribution line pair are separated by a second distance that is smaller than the first distance, and
wherein a distance between respective third portions of the first and second distribution lines within each distribution line pair gradually decreases in a direction away from the chip mounting portion, and a distance between respective third portions of adjacent distribution line pairs gradually increases in a direction away from the chip mounting portion.

2. The tape distribution substrate of claim 1, wherein the first portions of adjacent distribution line pairs among the plurality of distribution line pairs are separated by a third distance and the second portions of adjacent pairs of distribution lines are separated by a fourth distance;
wherein the third distance is smaller than the fourth distance.

3. The tape distribution substrate of claim 2, wherein the third distance is smaller than the first distance and the fourth distance is smaller than the second distance.

4. The tape distribution substrate of claim 1, further comprising:
a protective layer formed on the base film to protect the plurality of distribution line pairs.

5. The tape distribution substrate of claim 4, wherein the protective layer is formed to cover the first portions of the first and second distribution lines of each distribution line pair.

6. The tape distribution substrate of claim 5, wherein the first portions of the first and second distribution lines extend away from the chip mounting portion by a fifth distance that is determined by a tolerance of a process used to form the protective layer.

7. The tape distribution substrate of claim 6, wherein the fifth distance is greater than or equal to 200 μm.

8. The tape distribution substrate of claim 4, wherein the protective layer comprises solder resist.

9. The tape distribution substrate of claim 1, wherein the plurality of distribution line pairs comprises data signal distribution lines.

10. A tape distribution substrate comprising:
a base film including a chip mounting portion on which a semiconductor chip is mounted; and,
a plurality of distribution lines formed on the base film and extending across a non-chip portion of the base film outside the chip mounting portion, wherein each of the distribution lines receives a first signal and provides a plurality of second signals to the semiconductor chip on the chip mounting portion, wherein each of the second signals is substantially identical to the first signal;
wherein each of the distribution lines comprises a body portion disposed in the non-chip portion and including one or more holes and adapted to receive the first signal and a plurality of sub-distribution lines extending from the body portion toward the chip mounting portion to provide the plurality of second signals to the semiconductor chip.

11. The tape distribution substrate of claim 10, further comprising:
a protective layer formed on the base film to protect the plurality of distribution lines.

12. The tape distribution substrate of claim 11, wherein the sub-distribution lines extend outside the chip mounting portion by a predetermined distance determined by a tolerance of a process used to form the protective layer.

13. The tape distribution substrate of claim 12, wherein the predetermined distance is greater than or equal to 200 μm.

14. The tape distribution substrate of claim 11, wherein the protective layer comprises solder resist.

15. The tape distribution substrate of claim 10, wherein the holes are arranged so that the body portion has a mesh shape.

16. The tape distribution substrate of claim 10, wherein the distribution lines are power distribution lines for transmitting a power voltage or a ground voltage.

17. A tape distribution substrate comprising:
- a base film including a chip mounting portion on which a semiconductor chip is mounted;
- a plurality of distribution lines arranged on the base film in a non-chip portion outside the chip mounting portion, and providing a plurality of signals to the semiconductor chip mounted in the chip mounting portion; and,
- a dummy distribution pattern formed adjacent to the plurality of distribution lines in the non-chip portion, wherein the dummy distribution pattern has a plurality of holes arranged such that the dummy distribution pattern has a mesh shape.

18. The tape distribution substrate of claim 17, further comprising:
- a protective layer formed on the base film to protect the plurality of distribution lines.

* * * * *